United States Patent
Takeno et al.

(10) Patent No.: US 8,338,277 B2
(45) Date of Patent: Dec. 25, 2012

(54) METHOD FOR MANUFACTURING SOI SUBSTRATE

(75) Inventors: Hiroshi Takeno, Annaka (JP); Tohru Ishizuka, Annaka (JP); Nobuhiko Noto, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 682 days.

(21) Appl. No.: 12/449,347

(22) PCT Filed: Feb. 19, 2008

(86) PCT No.: PCT/JP2008/000258
§ 371 (c)(1),
(2), (4) Date: Aug. 4, 2009

(87) PCT Pub. No.: WO2008/120431
PCT Pub. Date: Oct. 9, 2008

(65) Prior Publication Data
US 2010/0323502 A1    Dec. 23, 2010

(30) Foreign Application Priority Data
Mar. 28, 2007 (JP) ................. 2007-084546

(51) Int. Cl.
*H01L 21/20* (2006.01)

(52) U.S. Cl. .......... 438/480; 438/149; 438/162

(58) Field of Classification Search ............ 438/479, 438/480, 149, 162
See application file for complete search history.

(56) References Cited

U.S. PATENT DOCUMENTS

| 5,658,809 | A | 8/1997 | Nakashima et al. |
| 5,930,643 | A | 7/1999 | Sadana et al. |
| 2002/0022348 | A1* | 2/2002 | Sakaguchi et al. ............ 438/480 |
| 2007/0020949 | A1 | 1/2007 | Aoki et al. |

FOREIGN PATENT DOCUMENTS

| JP | A-63-217657 | 9/1988 |
| JP | A-4-264724 | 9/1992 |
| JP | A-7-263538 | 10/1995 |

(Continued)

OTHER PUBLICATIONS

Nakashima et al., "Analysis of buried oxide layer formation and mechanism of threading dislocation generation in the substoichiometric oxygen dose region," *J. Mater. Res.*, vol. 8, No. 3, Mar. 1993, pp. 523-534.

(Continued)

*Primary Examiner* — Kevin M Picardat
(74) *Attorney, Agent, or Firm* — Oliff & Berridge, PLC

(57) ABSTRACT

The present invention provides a method for manufacturing an SOI substrate including at least: an oxygen ion implantation step of ion-implanting oxygen ions from one main surface of a single-crystal silicon substrate to form an oxygen ion implanted layer; and a heat treatment step of performing a heat treatment with respect to the single-crystal silicon substrate having the oxygen ion implanted layer formed therein to change the oxygen ion implanted layer into a buried oxide film layer, wherein acceleration energy for the oxygen ion implantation is previously determined from a thickness of the buried oxide film layer to be obtained, and the oxygen ion implantation step is carried out with the determined acceleration energy to manufacture the SOI substrate. Thereby, it is possible to provide an SOI substrate manufacturing method that enables efficiently manufacturing an SOI substrate having a continuous and uniform thin buried oxide film layer.

2 Claims, 1 Drawing Sheet

FOREIGN PATENT DOCUMENTS

JP        A-2007-5563        1/2007

OTHER PUBLICATIONS

*VLSI Device Handbook*, Nov. 28, 1983, Science Forum Inc., pp. 106-110.

Ishikawa et al., "Preparation of Thin Silicon-on-Insulator Films by Low-Energy Oxygen Ion Implantation," *Japanese Journal of Applied Physics*, vol. 30, No. 10, Oct. 1991, pp. 2427-2431.

Jul. 31, 2012 Office Action issued in Japanese Patent Application No. 2007-084546 (with partial translation).

* cited by examiner

METHOD FOR MANUFACTURING SOI SUBSTRATE

TECHNICAL FIELD

The present invention relates to a method for manufacturing an SOI (Silicon on Insulator) substrate based on an SIMOX (Separation by Implanted Oxygen) method for ion-implanting oxygen ions into a single-crystal silicon substrate and then performing a heat treatment to form a buried silicon oxide film layer in the single-crystal silicon substrate.

BACKGROUND ART

As one of semiconductor device substrates, there is an SOI substrate having a silicon layer (which may be referred to as an SOI layer hereinafter) formed on a silicon oxide film as an insulator film. This SOT substrate has characteristics such as a low parasitic capacitance or a high radiation-proof capability since the SOI layer in a wafer surface layer portion serving as a device fabrication region is electrically separated from the inside of the substrate due to a buried silicon oxide film layer (a BOX layer). Therefore, effects such as a high-speed and low-power consumption operation or soft error prevention can be expected, and this substrate appears promising as a high-performance semiconductor device substrate.

As a typical method for manufacturing this SOI substrate, there is a wafer bonding method or an SIMOX method. The wafer bonding method is a method for, e.g., forming a thermal oxide film on a surface of at least one of two single-crystal silicon substrates (silicon wafers), then closely attaching the two wafers to each other via the formed thermal oxide film, performing a bonding heat treatment to increase bonding strength, and thereafter reducing a film thickness of one wafer by, e.g., mirror polishing to manufacture an SOI substrate.

On the other hand, the SIMOX method is a method for ion-implanting oxygen into a single-crystal silicon substrate, then performing a high-temperature heat treatment (an oxide film forming heat treatment) to react the implanted oxygen and silicon, thereby forming a buried oxide film layer.

Specifically, for example, oxygen ions ($O^+$ in general) are first implanted into a single-crystal silicon substrate heated to approximately 500° C. from one surface. As ion implantation conditions, generally, an accelerating voltage is 150 to 200 keV, and an oxygen dose amount is classified into a high dose that approximately $1 \times 10^{18}$ to $2 \times 10^{18}$ atoms/cm² or more is implanted and a low dose that a smaller amount is implanted. After the oxygen ions are implanted, the implanted oxygen (an oxygen ion implanted layer) can be changed into an oxide film (a buried oxide film layer) having a thickness of approximately 220 nm to 440 nm by performing an oxide film forming heat treatment at a high temperature (1300° C. or above in general) in an inert gas atmosphere containing 1% or below of oxygen.

As compared with the wafer bonding method, such an SOI substrate manufacturing method based on the SIMOX method has advantages that a manufacturing process is simple, manufacture is possible at a relatively low cost since manufacture from one single-crystal silicon substrate is possible without requiring two wafers, film thickness uniformity of an SOI layer is excellent since an oxygen implantation depth can be controlled by using implantation energy, and others. Therefore, an SOI substrate manufactured based on the SIMOX method (an SIMOX substrate) is expected as a material of a fully-depleted transistor in which an SOI layer is, e.g., 50 nm or below, and others.

However, this SIMOX substrate has a problem that the buried oxide film layer has a dielectric breakdown voltage inferior to that of the thermal oxide film formed based on the wafer bonding method and also has a high density of threading dislocations that occur in the SOI layer, thereby degrading device characteristics.

Thus, to reduce occurrence of the threading dislocations in such an SOI layer, there is developed a low-dose SIMOX technique that performs oxygen ion implantation with a low dose amount ($2.5 \times 10^{17}$ to $5.0 \times 10^{17}$ atoms/cm²) to manufacture an SIMOX substrate based on discovery of a fact that a threading dislocation density is dependent on an oxygen dose amount (Japanese Unexamined Patent Publication (Kokai) No. H4-264724). Further, when carrying out the SIMOX method with such a low dose amount, to obtain a buried oxide film layer having an excellent dielectric breakdown voltage and an SOI layer having a low threading dislocation density, a dose amount of oxygen ions must be approximately $3.5 \times 10^{17}$ to $4 \times 10^{17}$ atoms/cm² (Journal of Materials Research, Vol. 8, No. 3, 1993, pp. 523-534), and a range of such a dose amount is known as a dose window. In this case, a thickness of a buried oxide film layer formed by performing an oxide film forming heat treatment after oxygen ion implantation is limited to approximately 80 nm to 90 nm.

Furthermore, as a technique that provides an SOI substrate having a structure in which a film thickness of a buried oxide film layer is increased and flatness of a buried oxide film interface is improved with a very low rate of occurrence of pinholes (regions that are not locally oxidized in the buried oxide film layer), there is, e.g., ITOX (Internal Thermal Oxidation) processing for performing an oxide film forming heat treatment to form a buried oxide film layer and then carrying out an oxidation heat treatment in a high-temperature oxygen atmosphere to grow the buried oxide film layer (Japanese Unexamined Patent Publication (Kokai) No. H7-263538).

Giving a more specific explanation, according to this ITOX processing, after ion-implanting oxygen ions under a low-dose condition, an oxide film forming heat treatment is performed at 1300° C. or above for several hours in an atmosphere where an oxygen partial pressure is less than 1% to form a buried oxide film layer, and thereafter a heat treatment is further effected at 1300° C. or above for several hours in an atmosphere where an oxygen partial pressure is approximately 70%, thereby growing the buried oxide film to increase a film thickness thereof. Performing this ITOX processing enables obtaining effects that a dielectric breakdown voltage of the buried oxide film layer can be improved, an interface of an SOI layer/the buried oxide film layer can be flattened, and surface roughness of a surface of the SOI layer can be improved. Moreover, this processing also has an advantage that the SOI layer is consumed when the oxide film is grown on the surface of the SOI layer, thereby obtaining the thin-film SOI layer.

Further, as an applicative technique of the low-dose SIMOX method or the ITOX processing, an attempt to amorphize a crystal to facilitate growth of a buried oxide film layer by ion-implanting a low dose amount of oxygen ions at a room temperature or ion-implanting oxygen and an element other than oxygen, e.g., silicon, after ion implantation of a low dose amount of oxygen ions is often made (e.g., Japanese Unexamined Patent Publication (Kokai) No. S63-217657, Specification of U.S. Pat. No. 5,930,643, and others).

According to such ITOX processing or other applicative technique, a dielectric breakdown voltage of the buried oxide film layer can be improved compared to that in the regular low-dose SIMOX method, but the obtained buried oxide film layer is restricted to have a large thickness.

In recent years, in an SOI substrate, a thick buried oxide film layer may be demanded to increase a dielectric breakdown voltage and, on the other hand, a thin buried oxide film layer may be demanded to improve heat conduction at the time of a device operation or to be used as a back gate oxide film, and hence a technique that can manufacture an SOI substrate in which a film thickness of a buried oxide film layer is reduced to a desired buried oxide film layer thickness of, e.g., 80 nm or below is required.

However, a thickness of a buried oxide film layer formed based on the conventional SIMOX method is restricted to a fixed range as explained above, and a continuous and uniform thin buried oxide film layer cannot be obtained.

It is to be noted that a thin buried oxide film layer means a buried oxide film layer having a thickness of 80 nm or below hereinafter unless stated.

DISCLOSURE OF INVENTION

In view of the above-described problem, it is an object of the present invention to provide an SOI substrate manufacturing method that enables efficiently manufacturing an SOI substrate having a continuous and uniform thin buried oxide film layer.

To achieve this object, the present invention provides a method for manufacturing an SOI substrate including at least: an oxygen ion implantation step of ion-implanting oxygen ions from one main surface of a single-crystal silicon substrate to form an oxygen ion implanted layer; and a heat treatment step of performing a heat treatment with respect to the single-crystal silicon substrate having the oxygen ion implanted layer formed therein to change the oxygen ion implanted layer into a buried oxide film layer, wherein acceleration energy for the oxygen ion implantation is previously determined from a thickness of the buried oxide film layer to be obtained, and the oxygen ion implantation step is carried out with the determined acceleration energy to manufacture the SOI substrate.

In this case, it is preferable that the oxygen ion implantation is carried out with the acceleration energy with which a thickness $t_{BOX}$ of the buried oxide film layer to be obtained and a standard deviation $\Delta Rp$ of an in-depth concentration distribution of oxygen ion-implanted into the single-crystal silicon substrate can satisfy a formula $\Delta Rp \leq t_{BOX}$.

The standard deviation $\Delta Rp$ of the in-depth concentration distribution of the oxygen that is ion-implanted into the single-crystal silicon substrate is dependent on the acceleration energy for the oxygen ion implantation. That is, $\Delta Rp$ becomes low as the acceleration energy decreases. Further, when $\Delta Rp$ is equal to or below the thickness $t_{BOX}$ of the buried oxide film layer to be obtained as described above, the oxygen is apt to uniformly aggregate in a subsequent oxide film forming heat treatment, thereby facilitating formation of the continuous and uniform buried oxide film layer. Contrarily, when $\Delta Rp$ is larger than $t_{BOX}$, the oxygen hardly uniformly aggregates in the subsequent oxide film forming heat treatment, and hence formation of the continuous and uniform buried oxide film layer is difficult.

Therefore, when the oxygen ion implantation is performed with the acceleration energy that the thickness $t_{BOX}$ of the buried oxide film layer to be obtained and the standard deviation $\Delta Rp$ of the in-depth concentration distribution of the oxygen to be ion-implanted into the single-crystal silicon substrate can satisfy the formula $\Delta Rp \leq t_{BOX}$ as described above, the oxygen can readily uniformly aggregate in the subsequent oxide film forming heat treatment, thereby facilitating formation of the continuous and uniform buried oxide film layer.

Furthermore, it is preferable that a dose amount of the oxygen ion implantation is set to $3.5 \times 10^{17}$ atoms/cm$^2$ or below and the acceleration energy is set to 110 keV or below.

Performing the oxygen ion implantation under such conditions enables assuredly forming a thin buried oxide film layer having a film thickness of 80 nm or below as the continuous and uniform buried oxide film layer.

In this case, it is preferable that the dose amount of the oxygen ion implantation is set to $2.25 \times 10^{17}$ atoms/cm$^2$ or below and the acceleration energy is set to 60 keV or below.

Performing the oxygen ion implantation under such conditions enables forming the continuous and uniform buried oxide film layer having a thickness of 50 nm or below.

When the SOI substrate manufacturing method according to the present invention is adopted, an SOI substrate having the continuous and uniform thin buried oxide film layer can be efficiently manufactured. Moreover, since any other special processing or the like is not required, the present invention is convenient. Additionally, since the high-quality thin buried oxide film can be formed with low energy, a size and a cost of an ion-implantor can be reduced.

BEST MODE(S) FOR CARRYING OUT THE INVENTION

Figure 1:
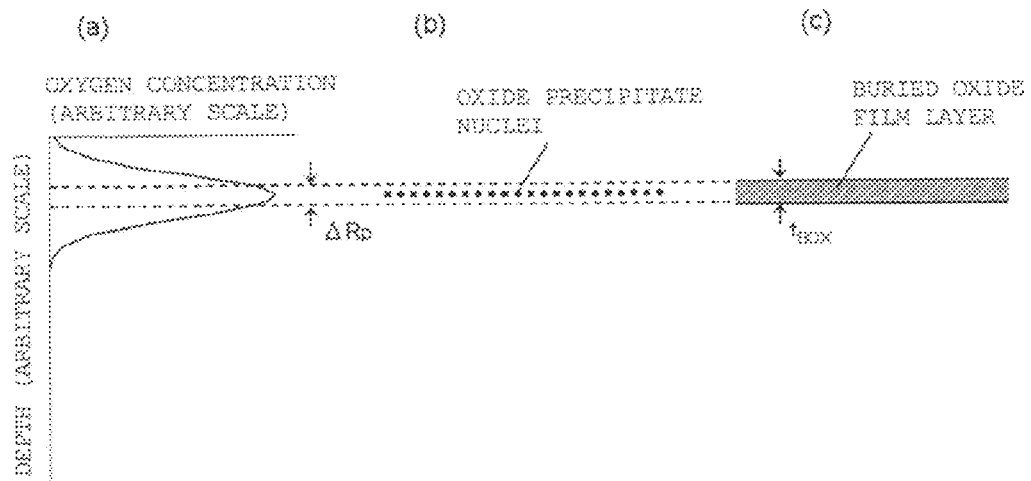
FIG. 1 is an explanatory view schematically showing states until a buried oxide film is finally obtained when variation in an in-depth concentration distribution of oxygen to be ion-implanted is small, in which (a) shows a state of variation of the in-depth concentration distribution of the ion-implanted oxygen, (b) shows a state of a distribution of oxide precipitate nuclei, and (c) shows a state of the finally obtained buried oxide film layer.

The present invention will now be described hereinafter in detail, but the present invention is not restricted thereto.

In manufacture of an SOI substrate based on an SIMOX method that is conventionally carried out, manufacturing an SOI substrate having a continuous and uniform thin buried oxide film layer is an important issue as described above.

Thus, the present inventors repeatedly conducted experiments and examinations about the method for manufacturing an SOI substrate based on the SIMOX method to solve the above issue, and considered as follows.

Usually, a buried oxide film layer of an SOI substrate manufactured by the SIMOX method is formed by forming, growing, and coupling precipitates of a silicon oxide (which may be referred to as oxide precipitates in some cases) in an oxygen ion implanted layer when an oxide film forming heat treatment is carried out after implanting oxygen ions. A minute oxide precipitate formed on the first stage of this oxygen precipitation process will be referred to as an oxide precipitate nucleus hereinafter.

It is considered that the buried oxide film layer is discontinuous in the SOI substrate manufactured based on the conventional SIMOX method because a density of the oxide precipitate nuclei is low and a distance between the individual oxide precipitate nuclei is large and hence the oxide precipitate nuclei cannot be coupled with each other even though they grow in the subsequent oxide film forming heat treatment. Further, it is considered that the buried oxide film layer becomes irregular and has an uneven thickness because depths at which oxide precipitate nuclei are formed are uneven, oxide precipitates grow from the oxide precipitate nuclei having the uneven depths and the oxide precipitates grow at the different depths. Therefore, it is considered that the continuous and uniform buried oxide film layer can be formed if the oxide precipitate nuclei having a high density can be formed and grown at a fixed depth.

The present inventors found that the oxide precipitate nuclei having a high density can be formed and grown at a fixed depth and the continuous and uniform buried oxide film layer can be formed by reducing variation in an in-depth concentration distribution of ion-implanted oxygen based on the above-described considerations.

Moreover, the present inventors further repeatedly conducted studies and examinations and thereby discovered that setting a standard deviation $\Delta Rp$ serving as an index of the variation of the in-depth concentration distribution of the ion-implanted oxygen to be equal to or below a thickness $t_{BOX}$ of the buried oxide film layer to be finally obtained enables assuredly forming and growing oxide precipitate nuclei having a high density at a fixed depth in the subsequent oxide film forming heat treatment, thereby forming the continuous and uniform buried oxide film layer.

The standard deviation $\Delta Rp$ of the in-depth concentration distribution of the ion-implanted oxygen is dependent on acceleration energy when implanting oxygen ions. That is, $\Delta Rp$ becomes low as the acceleration energy decreases. Therefore, when the acceleration energy with which $\Delta Rp$ becomes equal to or below $t_{BOX}$ is provided as an oxygen ion implantation condition, the oxide precipitate nuclei having a high density can be formed and grown at a fixed depth in the subsequent oxide film forming heat treatment, thus forming the continuous and uniform buried oxide film layer.

It is to be noted that general literatures (e.g., VLSI device handbook, Science Forum Inc., p. 108) can be consulted in regard to a relationship between the acceleration energy of oxygen ion implantation and the standard deviation $\Delta Rp$.

Figure 2:
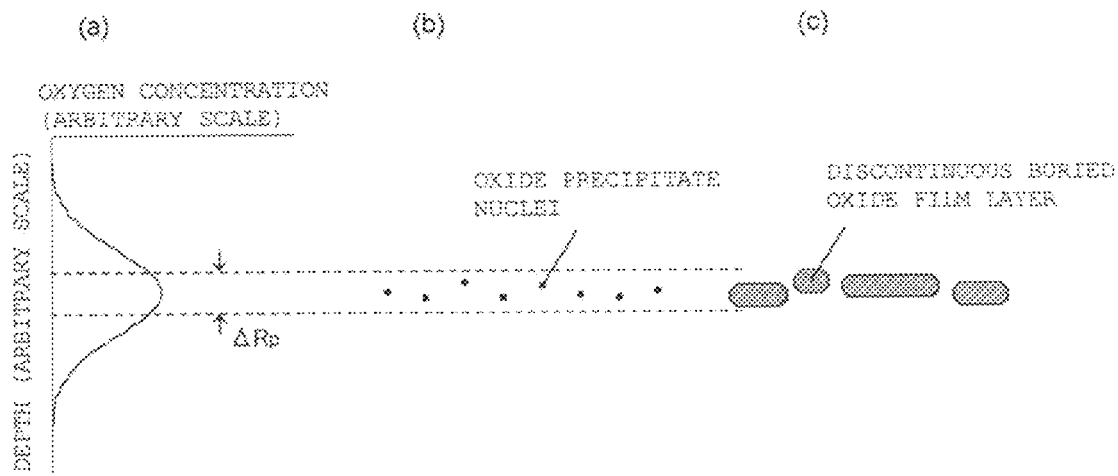
FIG. 2 is an explanatory view schematically showing states until a buried oxide film is finally obtained when variation in an in-depth concentration distribution of oxygen to be ion-implanted is large, in which (a) shows a state of variation of the in-depth concentration distribution of the ion-implanted oxygen, (b) shows a state of a distribution of oxide precipitate nuclei, and (c) shows a state of the finally obtained buried oxide film layer.

Schematically representing the above-described relationship in drawings, it is as shown in FIGS. 1 and 2.

As depicted in FIG. 1, when $\Delta Rp$ is low and it is, e.g., equal to or below $t_{BOX}$, since the variation of the in-depth concentration distribution of the ion-implanted oxygen becomes small (FIG. 1(a)), the oxide precipitate nuclei having a high density are formed at a fixed depth in the subsequent oxide film forming heat treatment (FIG. 1(b)), and these oxide precipitate nuclei grow, thereby obtaining the continuous and uniform buried oxide film layer (FIG. 1(c)). Further, since the oxygen is present in a narrow region in a depth direction, oxide precipitates can be readily aggregated when they grow.

On the other hand, as shown in FIG. 2, when $\Delta Rp$ is large and it is, e.g., larger than $t_{BOX}$, the variation of the in-depth concentration distribution of the ion-implanted oxygen becomes large (FIG. 2(a)), a density of the oxide precipitates formed in the subsequent oxide film forming heat treatment is low, depths at which the oxide precipitates are formed are uneven (FIG. 2(b)), and hence the oxide precipitates cannot be sufficiently coupled with each other even though they grow, thus resulting in a discontinuous buried oxide film layer having irregularities in the depth direction (FIG. 2(c)). Moreover, since the oxygen is present in a wide region in the depth direction, the oxide precipitates hardly aggregate when they grow, and the oxide precipitates cannot sufficiently grow, which is also a factor of formation of the discontinuous buried oxide film layer.

The present invention will now be described hereinafter in more detail with reference to the drawing, but the present invention is not restricted thereto.

Figure 3:
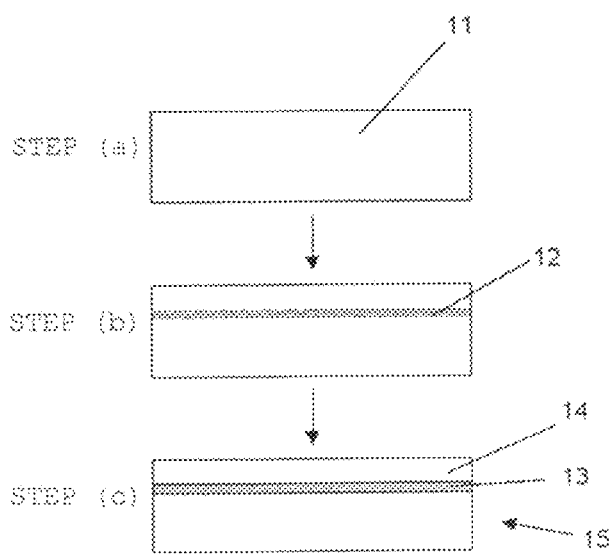
FIG. 3 is a flowchart showing an example of a method for manufacturing an SOI substrate based on an SIMOX method to which the present invention is applied.

FIG. 3 is a flow sheet showing an example of a method for manufacturing an SOI substrate based on the SIMOX method to which the present invention is applied. An outline of the method for manufacturing an SOI substrate according to the present invention is as follows.

First, a single-crystal silicon substrate 11 is prepared (Step a). The single-crystal silicon substrate 11 is not restricted in particular, and various kinds of substrates can be appropriately selected in accordance with a purpose.

Oxygen ions (e.g., $O^+$) are ion-implanted into the single-crystal silicon substrate 11 at a predetermined depth from one main surface to form an oxygen ion implanted layer 12 (Step b).

Here, in oxygen ion implantation conditions, acceleration energy is determined based on a relationship between the acceleration energy and a standard deviation $\Delta Rp$ of an in-depth concentration distribution of oxygen to be ion-implanted from a thickness of the buried oxide film layer to be obtained. At this time, determining acceleration energy with which $\Delta Rp$ becomes equal to or below a desired thickness $t_{BOX}$ of the buried oxide film layer (i.e., acceleration energy that enables satisfying a formula $\Delta Rp \leqq t_{BOX}$) is particularly preferable.

As to the relationship between the acceleration energy for the oxygen ion implantation and $\Delta Rp$, general literatures can be consulted as described above. For example, when $t_{BOX}$ is 50 nm, setting the acceleration energy to approximately 60 keV or below can suffice.

It is to be noted that a dose amount D of the oxygen ions can be calculated and determined from a value of $t_{BOX}$ based on the following formula (1).

$$D(\text{atoms/cm}^2) = 4.5 \times 10^{22}(\text{atoms/cm}^3) \times t_{BOX}(\text{cm}) \qquad (1)$$

For example, when $t_{BOX}$ is 50 nm, a dose amount of the oxygen ions can be set to $2.25 \times 10^{17}$ atoms/cm².

After the oxygen ion implanted layer 12 is formed on the single-crystal silicon substrate 11 in this manner, cleaning or the like is performed as required, and an oxide film forming heat treatment that changes the oxygen ion implanted layer 12 into a buried oxide film layer 13 is carried out, thereby manufacturing an SOI substrate 15 having an SOI layer 14 (Step c).

Although conditions for this oxide film forming heat treatment are not restricted in particular as long as the oxygen ion implanted layer 12 can be changed into the buried oxide film layer 13, the heat treatment can be performed at a heat treatment temperature of 1300° C. or above for a heat treatment time of several hours in an inert gas atmosphere containing 1% or a smaller percentage of oxygen. Further, as required, a heat treatment can be additionally effected at 1300° C. or above for several hours in an atmosphere where an oxygen partial pressure is approximately 70%, for example. It is to be noted that a film thickness of the SOI layer 14 can be controlled to a desired thickness by controlling a thickness of an oxide film formed on a wafer surface through changing these heat treatment conditions.

The SOI substrate having the continuous and uniform thin buried oxide film layer can be efficiently manufactured through the above-explained steps. Furthermore, the method according to the present invention does not require any other special processing (e.g., additional ion implantation) besides adjustment of the oxygen ion implantation conditions, and hence it is convenient.

The present invention will now be more specifically explained hereinafter based on examples and a comparative example of the present invention, but the present invention is not restricted thereto.

EXAMPLE 1

An SOI substrate was manufactured based on the SIMOX method in accordance with such a method for manufacturing an SOI substrate as depicted in FIG. 3.

First, a single-crystal silicon substrate 11 having a diameter of 300 mm manufactured based on a CZ method was prepared (Step a).

Then, oxygen ions were ion-implanted into this single-crystal silicon substrate 11 under the following ion implantation conditions to form an oxygen ion implanted layer 12 (Step b).

Here, a thickness of a buried oxide film layer to be finally formed was first set to 75 nm. Next, acceleration energy for oxygen ion implantation was determined as 100 keV in such a manner that a standard deviation $\Delta Rp$ of an in-depth concentration distribution of the ion-implanted oxygen can be 75 nm or below based on this target. It is to be noted that $\Delta Rp$ when the acceleration energy for oxygen ion implantation is 100 keV is 73.5 nm. Additionally, a dose amount of the oxygen ions was set to $3.38 \times 10^{17}$ atoms/cm$^2$ and a substrate temperature at the time of ion implantation was set to 560° C.

Then, standard cleaning was effected with respect to the silicon substrate having the oxygen ions implanted therein, and an oxide film forming heat treatment was performed in an argon atmosphere having an oxygen partial pressure of 0.5% at 1350° C. for four hours to form a buried oxide film layer 13 in the silicon substrate (Step c).

A state of the buried oxide film layer 13 was checked by observing a cross section of the thus manufactured SOI substrate 15 with a transmission electron microscope (TEM). As a result, realization of the continuous and uniform buried oxide film layer having a thickness of approximately 75 nm was confirmed, and the effects of the present invention were obtained.

EXAMPLE 2

Like Example 1, a single-crystal silicon substrate 11 having a diameter of 300 mm manufactured based on the CZ method was first prepared (Step a).

Then, oxygen ions were ion-implanted into this single-crystal silicon substrate 11 under the following ion implantation conditions to form an oxygen ion implanted layer 12 (Step b).

Here, a thickness of a buried oxide film layer to be finally formed was first set to 50 nm. Next, acceleration energy for oxygen ion implantation was determined as 60 keV in such a manner that a standard deviation $\Delta Rp$ of an in-depth concentration distribution of the ion-implanted oxygen can be 50 nm or below based on this target. It is to be noted that $\Delta Rp$ when the acceleration energy for oxygen ion implantation is 60 keV is 49.6 nm. Additionally, a dose amount of the oxygen ions was set to $2.25 \times 10^{17}$ atoms/cm$^2$ and a substrate temperature at the time of ion implantation was set to 560° C. like Example 1.

Then, standard cleaning was effected with respect to the silicon substrate having the oxygen ions implanted therein like Example 1, and an oxide film forming heat treatment was performed in an argon atmosphere having an oxygen partial pressure of 0.5% at 1350° C. for four hours to form a buried oxide film layer 13 in the silicon substrate (Step c).

A state of the buried oxide film layer 13 was checked by observing a cross section of the thus manufactured SOI substrate 15 with the TEM like Example 1. As a result, realization of the continuous and uniform buried oxide film layer having a thickness of approximately 50 nm was confirmed, and the effects of the present invention were obtained.

COMPARATIVE EXAMPLE

A single-crystal silicon substrate having a diameter of 300 mm manufactured based on the CZ method like Examples 1 and 2 was prepared (Step a).

Then, oxygen ions were ion-implanted into this single-crystal silicon substrate 11 under the following ion implantation conditions to form an oxygen ion implanted layer 12 (Step b).

Here, a thickness of a buried oxide film layer to be finally formed was first set to 50 nm like Example 2.

A dose amount of the oxygen ions was set to $2.25 \times 10^{17}$ atoms/cm$^2$ like Example 2, and a substrate temperature at the time of ion implantation was set to 560° C. which is the same temperature as those in Examples 1 and 2. However, for comparison with a result of Example 2, acceleration energy was set to 100 keV in such a manner that $\Delta Rp$ can purposefully exceed 50 nm. It is to be noted that $\Delta Rp$ when the acceleration energy for oxygen ion implantation is 100 keV is 73.5 nm.

Then, standard cleaning was effected with respect to the silicon substrate having the oxygen ions implanted therein like Examples 1 and 2, and an oxide film forming heat treatment was performed in an argon atmosphere having an oxygen partial pressure of 0.5% at 1350° C. for four hours to form a buried oxide film layer 13 in the silicon substrate (Step c).

A state of the buried oxide film layer 13 was checked by observing a cross section of the thus manufactured SOI substrate 15 with the TEM like Examples 1 and 2.

As a result, it was confirmed that the buried oxide film layer 13 was discontinuous and not sufficiently joined and irregularities were present in a depth direction.

As explained above, according to the present invention, it was proved that changing the acceleration energy to perform oxygen ion implantation in accordance with a thickness of the buried oxide film layer to be finally formed enables efficiently manufacturing the SOI substrate having the continuous and uniform thin buried oxide film layer.

It is to be noted that the present invention is not restricted to the foregoing embodiment. The foregoing embodiment is just an exemplification, and any examples which have substantially the same structures and demonstrate the same functions and effects as those in the technical concept described in claims of the present invention are contained in the technical scope of the present invention.

The invention claimed is:
1. A method for manufacturing an SOI substrate comprising at least:
an oxygen ion implantation step of ion-implanting oxygen ions from one main surface of a single-crystal silicon substrate to form an oxygen ion implanted layer; and a heat treatment step of performing a heat treatment with respect to the single-crystal silicon substrate having the oxygen ion implanted layer formed therein to change the oxygen ion implanted layer into a buried oxide film layer, wherein acceleration energy for the oxygen ion implantation is previously determined from a thickness of the buried oxide film layer to be obtained, the thickness being 80 nm or below;

the oxygen ion implantation step is carried out with the determined acceleration energy to manufacture the SOI substrate;

the oxygen ion implantation step is carried out with the acceleration energy with which a thickness $t_{BOX}$ of the buried oxide film layer to be obtained and a standard deviation $\Delta Rp$ of an in-depth concentration distribution of oxygen ion-implanted into the single-crystal silicon substrate can satisfy a formula $\Delta Rp \leq t_{BOX}$;

a dose amount of the oxygen ion implantation is $3.5 \times 10^{17}$ atoms/cm$^2$ or below; and the acceleration energy is 110 keV or below.

2. The method for manufacturing an SOI substrate according to claim 1, wherein the dose amount of the oxygen ion implantation is $2.25 \times 10^{17}$ atoms/cm$^2$ or below and the acceleration energy is 60 keV or below.

* * * * *